(12) United States Patent
Nulman et al.

(10) Patent No.: US 6,368,469 B1
(45) Date of Patent: *Apr. 9, 2002

(54) COILS FOR GENERATING A PLASMA AND FOR SPUTTERING

(75) Inventors: Jaim Nulman, Palo Alto; Sergio Edelstein, Los Gatos; Mani Subramani, San Jose; Zheng Xu, Foster City; Howard Grunes, Santa Cruz; Avi Tepman, Cupertino; John Forster, San Francisco; Praburam Gopalraja, Sunnyvale, all of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 08/851,946

(22) Filed: May 6, 1997

Related U.S. Application Data (63) Continuation of application No. 08/680,335, filed on Jul. 10, 1996, now abandoned, which is a continuation-in-part of application No. 08/644,096, filed on May 10, 1996, now abandoned, which is a continuation-in-part of application No. 08/647,184, filed on May 9, 1996, now abandoned.

(51) Int. Cl.[7] .............................................. C23C 14/34
(52) U.S. Cl. ........................... 204/192.12; 204/298.06; 204/298.08; 204/298.11
(58) Field of Search ....................... 204/298.06, 298.03, 204/192.12, 192.13, 298.08, 298.13, 298.26, 298.11; 118/723 E; 315/111.21, 111.51

(56) References Cited

U.S. PATENT DOCUMENTS

| | | | |
|---|---|---|---|
| 3,594,301 A | 7/1971 | Bruch | 204/298.26 |
| 3,619,402 A | 11/1971 | Wurm | 204/298.12 |
| 4,336,118 A | 6/1982 | Patten et al. | 204/192.3 |
| 4,362,632 A | 12/1982 | Jacob | 118/723 IR |

(List continued on next page.)

FOREIGN PATENT DOCUMENTS

| | | |
|---|---|---|
| DE | 1905058 | 8/1970 |
| EP | 0520519 | 12/1992 |
| EP | 0601595 | 12/1993 |
| EP | 0607797 | 1/1994 |
| EP | 0727807 | 1/1996 |
| EP | 0774886 | 5/1997 |
| EP | 0807954 | 11/1997 |
| GB | 2162365 | 1/1986 |
| GB | 2231197 | 11/1990 |
| JP | 56-047562 | 4/1981 |
| JP | 59190363 | 10/1984 |
| JP | 7176398 | 5/1986 |
| JP | 61-190070 | 8/1986 |

(List continued on next page.)

OTHER PUBLICATIONS

AT Search Report issued Nov. 19, 1999 in application SI9701437-7.
PCT Search Report issued in Appln PCT/US98/09739.
U.S. Ser. No. 08/857,720 (Atty. Dkt. No. 1800).
U.S. Ser. No. 08/857,921 (Atty. Dkt. No. 1737).
U.S. Ser. No. 08/857,944 (Atty. Dkt. 1871).
U.S. Ser. No. 08/907,382 (Atty. Dkt. 1957).

(List continued on next page.)

Primary Examiner—Rodney G. McDonald
(74) Attorney, Agent, or Firm—Konrad, Raynes, Victor & Mann, LLP

(57) ABSTRACT

A sputtering coil for a plasma chamber in a semiconductor fabrication system is provided. The sputtering coil couples energy into a plasma and also provides a source of sputtering material to be sputtered onto a workpiece from the coil to supplement material being sputtered from a target onto the workpiece. Alternatively a plurality of coils may be provided, one primarily for coupling energy into the plasma and the other primarily for providing a supplemental source of sputtering material to be sputtered on the workpiece.

54 Claims, 8 Drawing Sheets

U.S. PATENT DOCUMENTS

| | | | |
|---|---|---|---|
| 4,626,312 A | 12/1986 | Tracy | 204/298.34 |
| 4,661,228 A | 4/1987 | Mintz | 204/298.18 |
| 4,716,491 A | 12/1987 | Ohno et al. | 204/192.34 |
| 4,792,732 A | 12/1988 | O'Loughlin | 315/334 |
| 4,842,703 A | 6/1989 | Class et al. | 204/298.18 |
| 4,844,775 A | 7/1989 | Keeble | 118/50.1 |
| 4,865,712 A | 9/1989 | Mintz | 204/192.12 |
| 4,871,421 A | 10/1989 | Ogle et al. | 156/345 |
| 4,918,031 A | 4/1990 | Flamm et al. | 204/192.25 |
| 4,925,542 A | 5/1990 | Kidd | 427/531 |
| 4,941,915 A | 7/1990 | Matsuoka et al. | 204/192.11 |
| 4,948,458 A | 8/1990 | Ogle | 118/50.1 |
| 4,990,229 A | 2/1991 | Campbell et al. | 204/298.06 |
| 4,999,096 A | 3/1991 | Nihei et al. | 204/192.15 |
| 5,065,698 A | 11/1991 | Koike | 118/719 |
| 5,091,049 A | 2/1992 | Campbell et al. | 216/37 |
| 5,122,251 A | 6/1992 | Campbell et al. | 204/298.06 |
| 5,135,629 A | 8/1992 | Sawada et al. | 204/192.12 |
| 5,146,137 A | 9/1992 | Gesche et al. | 315/111.21 |
| 5,175,608 A | 12/1992 | Nihei et al. | 257/751 |
| 5,178,739 A | 1/1993 | Barnes et al. | 204/298.06 |
| 5,206,516 A | 4/1993 | Keller et al. | 250/492.2 |
| 5,225,740 A | 7/1993 | Ohkawa | 204/298.37 |
| 5,231,334 A | 7/1993 | Paranjpe | 156/345 |
| 5,234,529 A | 8/1993 | Johnson | 156/345 |
| 5,234,560 A | 8/1993 | Kadlec et al. | 204/192.12 |
| 5,241,245 A | 8/1993 | Barnes et al. | 315/111.41 |
| 5,280,154 A | 1/1994 | Cuomo et al. | 156/345 |
| 5,304,279 A | 4/1994 | Coultas et al. | 156/345 |
| 5,312,717 A | 5/1994 | Sachdev et al. | 430/313 |
| 5,346,578 A | 9/1994 | Benzing et al. | 156/345 |
| 5,361,016 A | 11/1994 | Ohkawa et al. | 315/111.41 |
| 5,366,585 A | 11/1994 | Robertson et al. | 156/345 |
| 5,366,590 A | 11/1994 | Kadomura | 438/723 |
| 5,368,685 A | 11/1994 | Kumihashi et al. | 156/345 |
| 5,397,962 A | 3/1995 | Moslehi | 315/111.51 |
| 5,401,350 A | 3/1995 | Patrick et al. | 156/345 |
| 5,404,079 A | 4/1995 | Ohkuni et al. | 315/111.81 |
| 5,417,834 A | 5/1995 | Latz | 204/298.1 |
| 5,418,431 A | 5/1995 | Williamson et al. | 118/723 AN |
| 5,421,891 A | 6/1995 | Campbell et al. | 118/723 R |
| 5,429,070 A | 7/1995 | Campbell et al. | 118/723 R |
| 5,429,710 A | 7/1995 | Akiba et al. | 438/714 |
| 5,429,995 A | 7/1995 | Nishiyama et al. | 438/788 |
| 5,430,355 A | 7/1995 | Paranjpe | 315/111.21 |
| 5,434,353 A | 7/1995 | Kraus | 174/15.6 |
| 5,464,518 A | 11/1995 | Sieck et al. | 204/192.12 |
| 5,503,676 A | 4/1996 | Shufflebotham et al. | 118/723 MR |
| 5,560,776 A | 10/1996 | Sugai et al. | 118/723 AN |
| 5,573,595 A | 11/1996 | Dible | 118/723 E |
| 5,639,357 A | 6/1997 | Xu | 204/192.3 |
| 5,690,781 A | 11/1997 | Yoshida et al. | 156/345 |
| 5,961,793 A | 10/1999 | Ngan | 204/192.12 |
| 6,042,700 A * | 3/2000 | Gopalraja et al. | 204/192.15 |
| 6,210,539 B1 | 4/2001 | Tanaka et al. | 204/192.12 |
| 6,228,229 B1 | 5/2001 | Raajimakers et al. | 204/192.12 |
| 6,238,528 B1 | 5/2001 | Xu et al. | 204/192.12 |
| 6,254,748 B1 | 7/2001 | Subramani et al. | 204/298.11 |
| 6,264,812 B1 | 7/2001 | Raiijmakers et al. | 204/298.06 |

FOREIGN PATENT DOCUMENTS

| | | |
|---|---|---|
| JP | 63246814 | 10/1988 |
| JP | 6 232055 | 8/1994 |
| JP | 6 283470 | 10/1994 |
| JP | 7176399 | 7/1995 |
| JP | 888190 | 4/1996 |
| JP | 8153712 | 6/1996 |
| JP | 8288259 | 11/1996 |
| WO | WO860623 | 11/1986 |
| WO | 8606923 | 11/1986 |
| WO | 9207969 | 5/1992 |
| WO | 9515672 | 6/1995 |

OTHER PUBLICATIONS

U.S. Ser. No. 08/971,867 (Atty. Dkt. 1957.P1).

U.S. Ser. No. 09/039,695 (Atty. Dkt. 1727).

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Metal Ion Deposition from Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. B13, pp. 125–129, 1995.

Y–W. Kim et al., "Ionized Sputter Deposition of AlCu: Film Microstructure and Chemistry," *J. Vac. Sci. Technol.*, vol. A12, pp. 3169–3175, 1994.

J. Hopwood et al., "Mechanisms for Highly Ionized Magnetron Sputtering," *J. Appl. Phys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7(4), 2652–2657, Jul./Aug. 1989.

U.S. application Ser. No. 08/680,335, filed Jul. 10, 1996 (Atty. Dk. 1390–CIP/PVD/DV).

N. Jiwari et al., "Helicon wave plasma reactor employing single–loop antenna," *J. of Vac. Sci. Technol.*, A 12(4), pp. 1322–1327, Jul./Aug. 1994.

Search report dated Feb. 27, 1997, EPC application No. 96308251.6

U.S. application Ser. No. 08/461,575, filed Sep. 30, 1992 (Atty. Dk. 364.F1).*

U.S. application Ser. No. 08/647,182, filed May 9, 1996 (Atty. Dk. 1186).*

U.S. application Ser. No. 08/559,345, filed Nov. 15, 1995 (Aty. Dk. 938/PVD/DV).*

U.S. application Ser. No. 08/733,620, filed Oct. 17, 1996 (Attorney Docket # 1457/PVD/DV).*

U.S. application Ser. No. 08/741,708, filed Oct. 31, 1996 (Attorney Docket # 1590/PVD/DV).*

U.S. application Ser. No. 08/853,024, filed May 8, 1997 (Atty. Dk. 1186.P1/PVD/DV).*

U.S. application Ser. No. 08/857,719, filed May, 16, 1997 (Atty. Dk. 1752/PVD/DV).*

EP 97303124.8 Search Report mailed Aug. 22, 1997 (Atty Dkt: 4979).

US 09/829,595 filed Apr. 10, 2001, full copy including specification, claims and drawings as filed; $1^{st}$ preliminary amendment; Formal Drawings; and $2^{nd}$ preliminary amendment (Att Dkt: 7042).

\* cited by examiner

COILS FOR GENERATING A PLASMA AND FOR SPUTTERING

This is a continuation of application Ser. No. 08/680,335, filed Jul. 10, 1996, now abandoned, which in turn is a continuation-in-part of application Ser. No. 08/644,096, filed May 10, 1996, now abandoned, which is a continuation-in-part of application Ser. No. 08/647,184, filed May 9, 1996, now abandoned.

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Low pressure radio frequency (RF) generated plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created within the plasma impact the surface of the target to dislodge, i.e., "sputter" material from the target. The sputtered materials are then transported and deposited on the surface of the semiconductor wafer.

Sputtered material has a tendency to travel in straight line paths from the target to the substrate being deposited at angles which are oblique to the surface of the substrate. As a consequence, materials deposited in etched trenches and holes of semiconductor devices having trenches or holes with a high depth to width aspect ratio, can bridge over causing undesirable cavities in the deposition layer. To prevent such cavities, the sputtered material can be redirected into substantially vertical paths between the target and the substrate by negatively charging the substrate and positioning appropriate vertically oriented electric fields adjacent the substrate if the sputtered material is sufficiently ionized by the plasma. However, material sputtered by a low density plasma often has an ionization degree of less than 1% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

In many high density plasma applications, it is preferable for the chamber to be operated at a relatively high pressure so that the frequency of collisions between the plasma ions and the deposition material atoms is increased to increase thereby the resident time of the sputtered material in the high density plasma zone. However, scattering of the deposition atoms is likewise increased. This scattering of the deposition atoms typically causes the thickness of the deposition layer on the substrate to be thicker on that portion of the substrate aligned with the center of the target and thinner in the outlying regions. It has been found that the deposition layer can be made more uniform by reducing the distance between the target and the substrate which reduces the effect of the plasma scattering.

On the other hand, in order to increase the ionization of the plasma to increase the sputtering rate and the ionization of the sputtered atoms, it has been found desirable to increase the distance between the target and the substrate. The coil which is used to couple energy into the plasma typically encircles the space between the target and the substrate. If the target is positioned too closely to the substrate, the ionization of the plasma can be adversely affected. Thus, in order to accommodate the coil which is coupling RF energy into the plasma, it has often been found necessary to space the target from the substrate a certain minimum distance even though such a minimum spacing can have an adverse effect on the uniformity of the deposition.

SUMMARY OF THE PREFERRED EMBODIMENTS

It is an object of the present invention to provide an improved method and apparatus for generating a plasma within a chamber and for sputter depositing a layer which obviate, for practical purposes, the above-mentioned limitations.

These and other objects and advantages are achieved by, in accordance with one aspect of the invention, a plasma generating apparatus which inductively couples electromagnetic energy from a coil which is also adapted to sputter material from the coil onto the workpiece to supplement the material being sputtered from a target onto the workpiece. The coil is preferably made of the same type of material as the target so that the atoms sputtered from the coil combine with the atoms sputtered from the target to form a layer of the desired type of material. It has been found that the distribution of material sputtered from a coil in accordance with one embodiment of the present invention tends to be thicker at the edges of the substrate and thinner toward the center of the substrate. Such a distribution is very advantageous for compensating for the distribution profile of material sputtered from a target in which the material from the target tends to deposit more thickly in the center of the substrate as compared to the edges. As a consequence, the materials deposited from both the coil and the target can combine to form a layer of relatively uniform thickness from the center of the substrate to its edges.

In one embodiment, both the target and the coil are formed from relatively pure titanium so that the material sputtered onto the substrate from both the target and the coil is substantially the same material, that is, titanium. In other embodiments, other types of materials may be deposited such as aluminum. In which case, the coil as well as the target would be made from the same grade of aluminum, i.e., target grade aluminum. In other embodiments the target can be made of a material such as Cr, Te or $SiO_2$. If it is desired to deposit a mixture or combination of materials, the target and the coil can be formed from the same mixture of materials or alternatively from different materials such that the materials combine or mix when deposited on the substrate.

In yet another embodiment, a second coil-like structure in addition to the first coil, provides a supplemental target for sputtering material. This second coil is preferably not coupled to an RF generator but is instead biased with DC power. Although material may or may not continue to be sputtered from the first coil, sputtered material from the coils will originate primarily from the second coil because of its DC biasing. Such an arrangement permits the ratio of the DC bias of the primary target to the DC bias of the second coil to be set to optimize compensation for non-uniformity in thickness of the material being deposited from the primary target. In addition, the RF power applied to the first coil can be set independently of the biases applied to the target and the second coil for optimization of the plasma density for ionization.

DETAILED DESCRIPTION OF THE DRAWINGS

Figure 1:
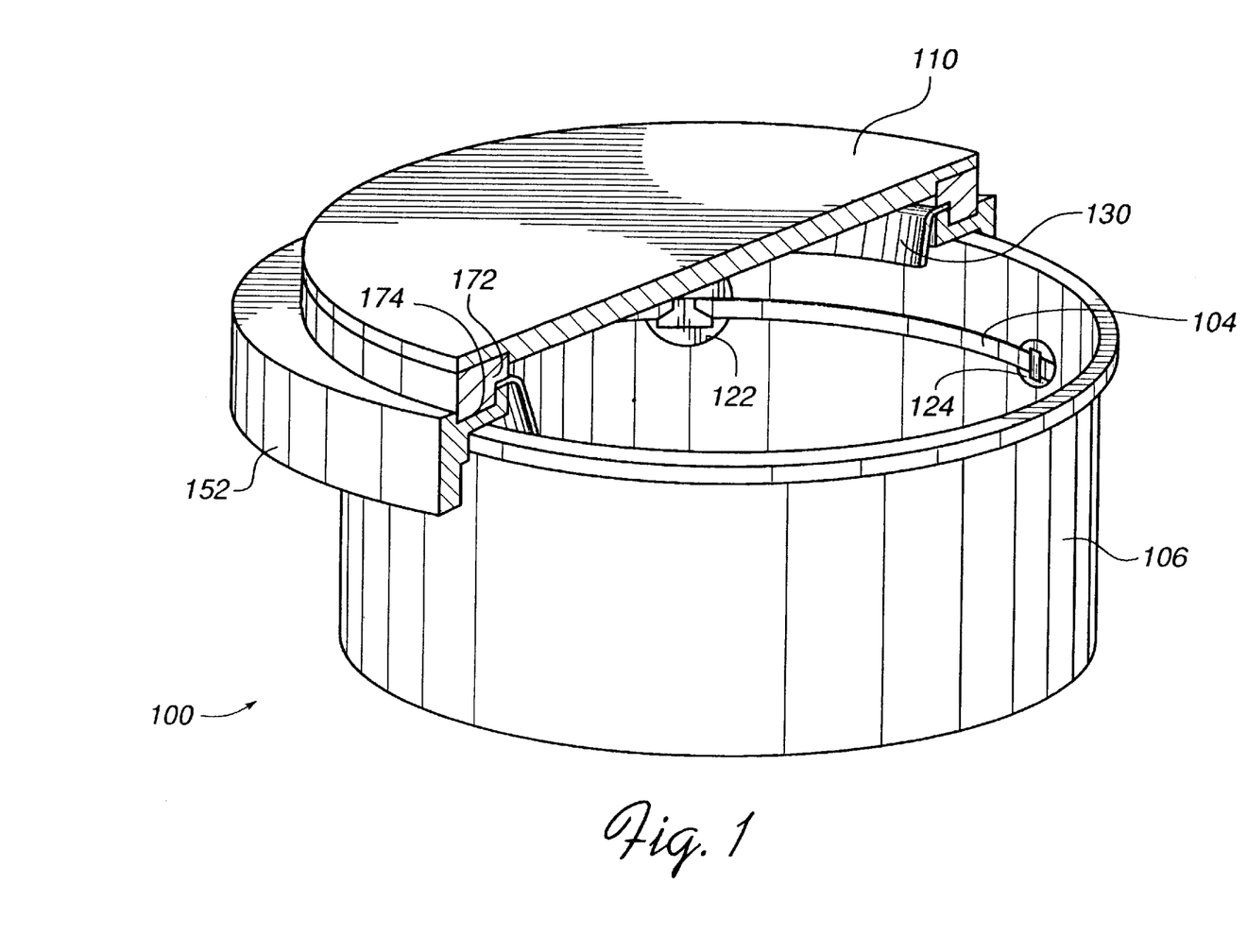
FIG. 1 is a perspective, partial cross-sectional view of a plasma generating chamber in accordance with one embodiment of the present invention.
Figure 2:
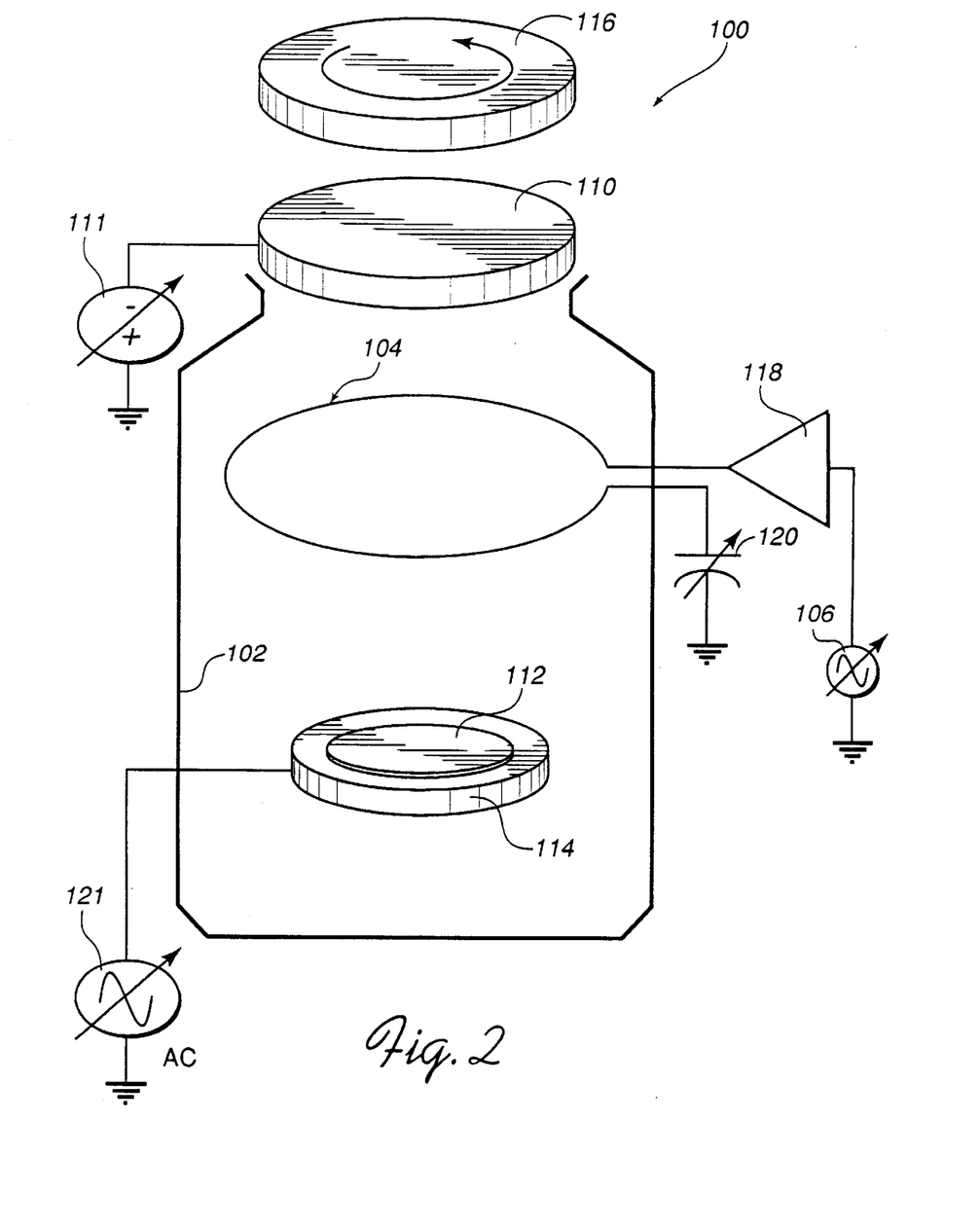
FIG. 2 is a schematic diagram of the electrical interconnections to the plasma generating chamber of FIG. 1.

Referring first to FIGS. 1 and 2, a plasma generator in accordance with a first embodiment of the present invention comprises a substantially cylindrical plasma chamber 100 which is received in a vacuum chamber 102 (shown schematically in FIG. 2). The plasma chamber 100 of this embodiment has a single turn coil 104 which is carried internally by a shield 106. The shield 106 protects the interior walls (not shown) of the vacuum chamber 102 from the material being deposited within the interior of the plasma chamber 100.

Radio frequency (RF) energy from an RF generator 106 is radiated from the coil 104 into the interior of the deposition system 100, which energizes a plasma within the deposition system 100. The energized plasma produces a plasma ion flux which strikes a negatively biased target 110 positioned at the top of the chamber 102. The target 110 is negatively biased by a DC power source 111. The plasma ions eject material from the target 110 onto a substrate 112 which may be a wafer or other workpiece which is supported by a pedestal 114 at the bottom of the deposition system 100. A rotating magnet assembly 116 provided above the target 110 produces magnetic fields which sweep over the face of the target 110 to promote uniform erosion of the target.

The atoms of material ejected from the target 110 are in turn ionized by the plasma being energized by the coil 104 which is inductively coupled to the plasma. The RF generator 106 is preferably coupled to the coil 104 through an amplifier and impedance matching network 118. The other end of the coil 104 is coupled to ground, preferably through a capacitor 120 which may be a variable capacitor. The ionized deposition material is attracted to the substrate 112 and forms a deposition layer thereon. The pedestal 114 may be negatively biasd by an AC (or DC or RF) source 121 so as to externally bias the substrate 112. As set forth in greater detail in copending application Ser. No. 08/677,588, filed Jul. 9, 1996 now abandoned, Express Mail Certificate No. EM 129 431 588, entitled "Method for Providing Full-Face High Density Plasma Deposition" by Ken Ngan, Simon Hui and Gongda Yao, which is assigned to the assignee of the present application and is incorporated herein by reference in its entirety, external biasing of the substrate 112 may optionally be eliminated.

As will be explained in greater detail below, in accordance with one aspect of the present invention, material is also sputtered from the coil 104 onto the substrate 112 to supplement the material which is being sputtered from the target 110 onto the workpiece. As a result, the layer deposited onto the substrate 112 is formed from material from both the coil 104 and the target 110 which can substantially improve the uniformity of the resultant layer.

The coil 104 is carried on the shield 106 by a plurality of coil standoffs 122 (FIG. 1) which electrically insulate the coil 104 from the supporting shield 106. As set forth in greater detail in copending application Ser. No. 08/647,182, entitled Recessed Coil for Generating a Plasma, filed May 9, 1996, now abandoned and assigned to the assignee of the present application, which application is incorporated herein by reference in its entirety, the insulating coil standoffs 122 have an internal labyrinth structure which permits repeated deposition of conductive materials from the target 110 onto the coil standoffs 122 while preventing the formation of a complete conducting path of deposited material from the coil 104 to the shield 106 which could short the coil 104 to the shield 106 (which is typically at ground).

RF power is applied to the coil 104 by feedthroughs (not shown) which are supported by insulating feedthrough standoffs 124. The feedthrough standoffs 124, like the coil support standoffs 122, permit repeated deposition of conductive material from the target onto the feedthrough standoff 124 without the formation of a conducting path which could short the coil 104 to the shield 106. Thus, the coil feedthrough standoff 124 has an internal labyrinth structure somewhat similar to that of the coil standoff 122 to prevent the formation of a short between the coil 104 and the wall 140 of the shield.

As best seen in FIG. 1, the plasma chamber 100 has a dark space shield ring 130 which provides a ground plane with respect to the target 110 above which is negatively biased. In addition, as explained in greater detail in the aforementioned copending application Ser. No. 08/647,182, the shield ring 130 shields the outer edges of the target from the plasma to reduce sputtering of the target outer edges. The dark space shield 130 performs yet another function in that it is positioned to shield the coil 104 (and the coil support standoffs 122 and feedthrough standoffs 124) from the material being sputtered from the target 110. The dark space shield 130 does not completely shield the coil 104 and its associated supporting structure from all of the material being sputtered since some of the sputtered material travels at an oblique angle with respect to the vertical axis of the plasma chamber 100. However, because much of the sputtered material does travel parallel to the vertical axis of the chamber or at relatively small oblique angles relative to the vertical axis, the dark space shield 130 which is positioned in an overlapping fashion above the coil 104, prevents a substantial amount of sputtered material from being deposited on the coil 104. By reducing the amount of material that would otherwise be deposited on the coil 104, the generation of particles by the material which is deposited on the coil 104 (and its supporting structures) can be substantially reduced.

In the illustrated embodiment, the dark space shield 130 is a closed continuous ring of titanium (where titanium deposition is occurring in the chamber 100) or stainless steel having a generally inverted frusto-conical shape. The dark space shield extends inward toward the center of plasma chamber 100 so as to overlap the coil 104 by a distance of ¼ inch. It is recognized, of course, that the amount of overlap can be varied depending upon the relative size and placement of the coil and other factors. For example, the overlap may be increased to increase the shielding of the coil 104 from the sputtered material but increasing the overlap could also further shield the target from the plasma which may be undesirable in some applications. In an alternative embodiment, the coil 104 may be placed in a recessed coil chamber (not shown) to further protect the coil and reduce particle deposits on the workpiece.

The chamber shield 106 is generally bowl-shaped and includes a generally cylindrically shaped, vertically oriented wall 140 to which the standoffs 122 and 124 are attached to insulatively support the coil 104. The shield further has a generally annularshaped floor wall (not shown) which surrounds the chuck or pedestal 114 which supports the workpiece 112 which has an 8" diameter in the illustrated embodiment. A clamp ring (not shown) may be used to clamp the wafer to the chuck 114 and cover the gap between the floor wall of the shield 106 and the chuck 114.

The plasma chamber 100 is supported by an adapter ring assembly 152 which engages the vacuum chamber. The chamber shield 106 is grounded to the system ground through the adapter ring assembly 152. The dark space shield 130, like the chamber shield 106, is grounded through the adapter ring assembly 152.

The target 110 is generally disk-shaped and is also supported by the adapter ring assembly 152. However, the target 110 is negatively biased and therefore should be insulated from the adapter ring assembly 152 which is at ground. Accordingly, seated in a circular channel formed in the underside of the target 110 is a ceramic insulation ring assembly 172 which is also seated in a corresponding channel 174 in the upper side of the target 152. The insulator ring assembly 172 which may be made of a variety of insulative materials including ceramics spaces the target 110 from the adapter ring assembly 152 so that the target 110 may be adequately negatively biased. The target, adapter and ceramic ring assembly are provided with O-ring sealing surfaces (not shown) to provide a vacuum tight assembly from the vacuum chamber to the target 110.

The coil 104 of the illustrated embodiment is made of ½ by ⅛ inch heavy duty bead blasted solid high-purity (preferably 99.995% pure) titanium ribbon formed into a single turn coil having a diameter of 10–12 inches. However, other highly conductive materials and shapes may be utilized depending upon the material being sputtered and other factors. For example, the ribbon may be as thin as ¹⁄₁₆ inch and exceed 2 inches in height. Also, if the material to be sputtered is aluminum, both the target and the coil may be made of high purity aluminum. In addition to the ribbon shape illustrated, hollow tubing may be utilized, particularly if water cooling is desired.

Figure 3:
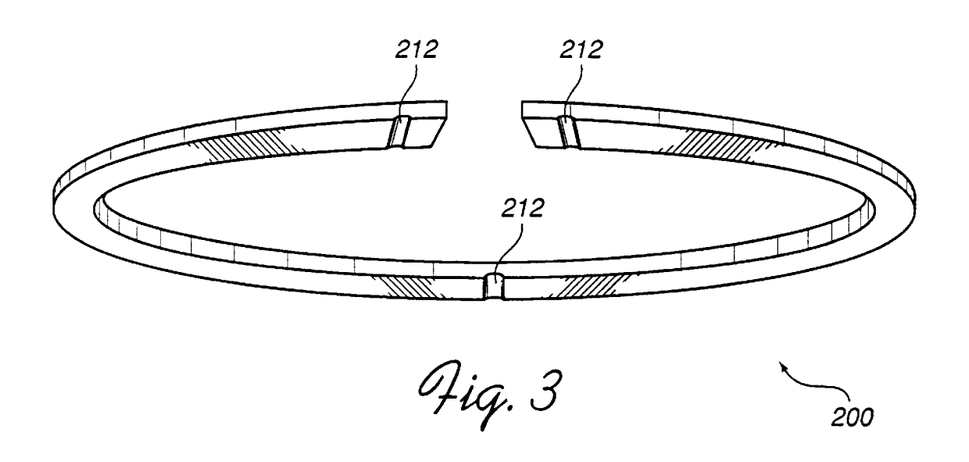
FIG. 3 is a perspective view of a coil ring for a plasma generating apparatus in accordance with another embodiment of the present invention.
Figure 4:
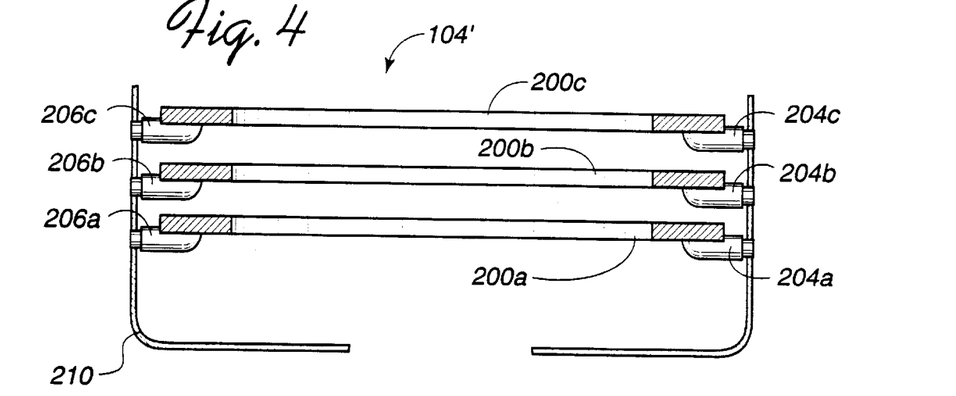
FIG. 4 is a schematic partial cross-sectional view of a plasma generating chamber in accordance with another embodiment of the present invention utilizing a coil ring as shown in FIG. 3.
Figure 5:
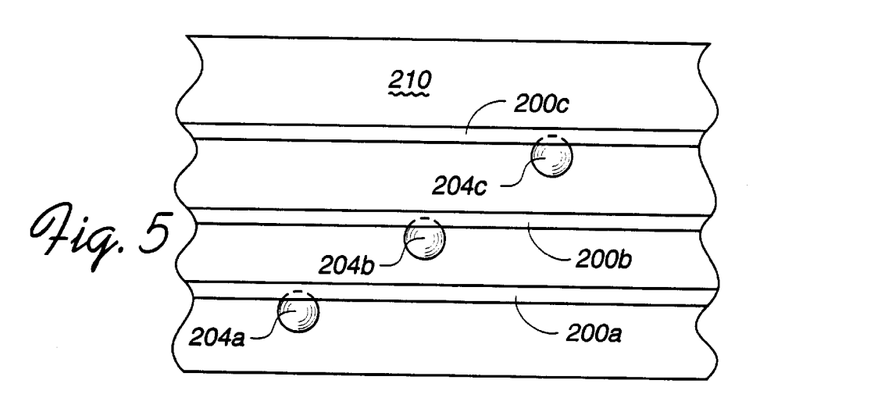
FIG. 5 illustrates a plurality of coil ring support standoffs for the plasma generating chamber of FIG. 4.

Still further, instead of the ribbon shape illustrated, each turn of the coil, where the coil has multiple turns, may be implemented with a flat, open-ended annular ring such as that illustrated at 200 in FIG. 3. Such an arrangement is particularly advantageous for multiple turn coils. The advantage of a multiple turn coil is that the required current levels can be substantially reduced for a given RF power level. However, multiple turn coils tend to be more complicated and hence most costly and difficult to clean as compared to single turn coils. For example, a three turn helical coil of titanium and its associated supporting structure could be quite expensive. The cost of manufacture of a multiple turn coil can be substantially reduced by utilizing several such flat rings 200a–200c to form a multiple turn coil 104' as illustrated in FIG. 4. Each ring is supported on one side by a support standoff 204a–204c and a pair of RF feedthrough standoffs 206a–206c and 208a–208c (FIG. 6) on the other side. As best seen in FIG. 5, the support standoffs 204a–204c are preferably positioned on the shield wall 210 in a staggered relationship. Each support standoff 204a–204c is received by a corresponding groove 212 (FIG. 3) formed in the underside of the corresponding coil ring 200 to secure the coil ring in place.

Figure 6:
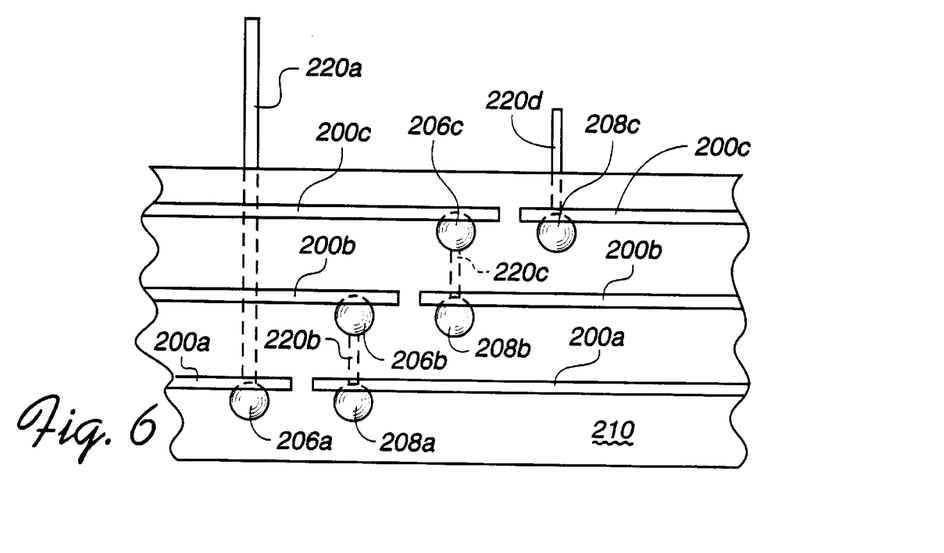
FIG. 6 illustrates a plurality of coil ring feedthrough standoffs for the plasma generating chamber of FIG. 4.

The coil rings 200a–200c are electrically connected together in series by RF feedthroughs which pass through the RF feedthrough standoffs 206a–206c and 208a–208c. In the same manner as the support standoffs 204a–204c, the feedthrough standoffs 206a–206c and 208a–208c are each received in a corresponding groove 212 (FIG. 3) formed in the underside of each coil ring adjacent each end of the coil ring. As schematically represented in FIG. 6, an RF waveguide 220a external to the shield wall is coupled by the RF feedthrough in feedthrough standoff 206a to one end of the lowest coil ring 200a. The other end of the coil ring 200a is coupled by the RF feedthrough in feedthrough standoff 208a to another external RF waveguide 220b which is coupled by the RF feedthrough in feedthrough standoff 206b to one end of the middle coil ring 200b. The other end of the coil ring 200b is coupled by the RF feedthrough in feedthrough standoff 208b to another external RF waveguide 220c which is coupled by the RF feedthrough in feedthrough standoff 206c to one end of the top coil ring 200c. Finally, the other end of the top coil ring 200c is coupled by the RF feedthrough in feedthrough standoff 208c to another external RF waveguide 220d. Coupled together in this manner, it is seen that the currents through the coil rings 200a–200c will be directed in the same direction such that the magnetic fields generated by the coil rings will constructively reinforce each other. Because the coil 104' is a multiple turn coil, the current handling requirements of the feedthrough supports 206 and 208 can be substantially reduced as compared to those of the feedthrough supports 124 of the single turn coil 104 for a given RF power level.

Figure 7:
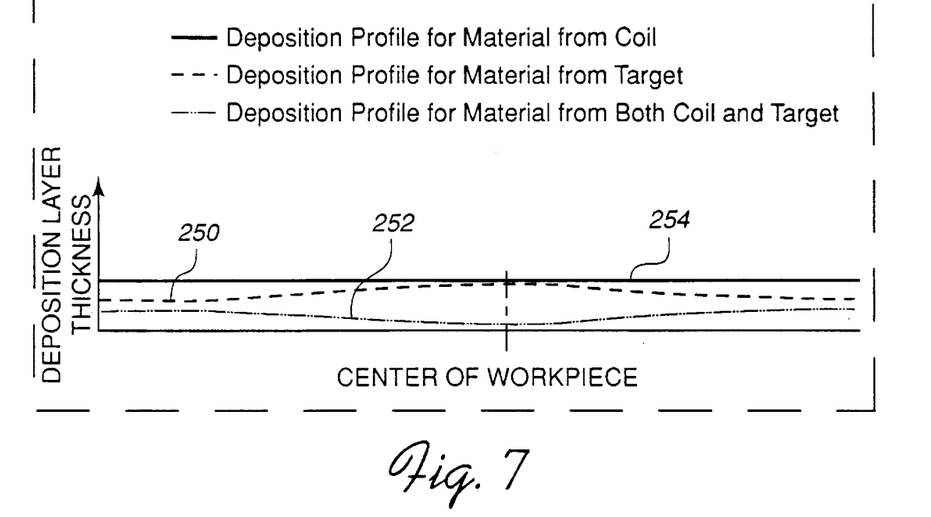
FIG. 7 is a chart depicting the respective deposition profiles for material deposited from the coil and the target of the apparatus of FIG. 1.

As previously mentioned, in order to accommodate the coil 104 to facilitate ionization of the plasma, it has been found beneficial to space the target 110 from the surface of the workpiece 112. However, this increased spacing between the target and the workpiece can adversely impact the uniformity of the material being deposited from the target. As indicated at 250 in FIG. 7, such nonuniformity typically exhibits itself as a thickening of the deposited material toward the center of the workpiece with a consequent thinning of the deposited material toward the edges of the workpiece. In accordance with one feature of the present invention, this nonuniformity can be effectively compensated by sputtering deposition material not only from the sputter target 110 above the workpiece but also from the coil 104 encircling the edges of the workpiece. Because the edges of the workpiece are closer to the coil 104 than is the center of the workpiece, it has been found that the material sputtered from the coil tends to deposit more thickly toward the edges of the workpiece than the center, as indicated at 252 in FIG. 3. This is of course the reverse of the deposition pattern of material from the target 110. By appropriately adjusting the ratio of RF power level applied to the coil 104 to the DC power level of the bias applied to the target, it has been found that the deposition level of the material being sputtered from the coil 104 can be selected in such a manner as to compensate substantially for the nonuniformity of the deposition profile of the material from the target such that the overall deposition profile of the layer from both sources of sputtered material as indicated by the deposition profile 254 in FIG. 7 can be substantially more uniform than that which has often been obtained from the target alone. It is preferred that the coil supply sufficient sputtered material such that the material sputtered from the coil be deposited at a rate of at least 50 Å per minute as measured at the edge of the wafer in addition to that material being sputtered from the target and deposited on the wafer.

Figure 8:
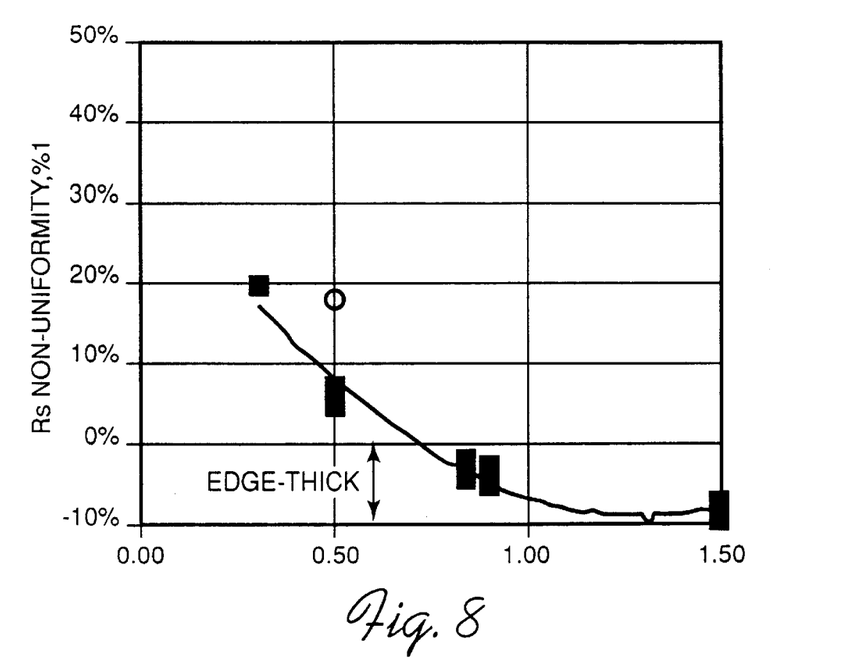
FIG. 8 is a graph depicting the effect on deposition uniformity of the ratio of the RF power applied to the coil relative to the DC power bias of the target.

It is presently believed that the amount of sputtering which originates from the coil 104 as compared to the sputtering which originates from the target 110 is a function of the RF power applied to the coil 104 relative to the DC power applied to the target 110. By adjusting the ratio of the coil RF power to the target DC power, the relative amounts of material sputtered from the coil 104 and the target 110 may be varied so as to achieve the desired uniformity. As shown in FIG. 8, it is believed that a particular ratio of the coil RF power to the target DC power will achieve the smallest degree (represented as 0%) of non-uniformity of the layer of material deposited from both the coil and the target. As the RF power to the coil is increased relative to the DC power applied to the target, the deposited layer tends to be more edge thick as represented by the increasingly negative percentage of non-uniformity as shown in FIG. 8. (In the sign convention of FIG. 8, an edge thick non-uniformity was chosen to be represented by a negative percentage of non-uniformity and a center thick non-uniformity was chosen to be represented by a positive percentage of non-uniformity. The larger the absolute value of the percentage non-uniformity, the greater the degree of non-uniformity (either edge thick or center thick) represented by that percentage. Conversely, by decreasing the ratio of the RF power to the coil relative to the DC power applied to the target, the center of the deposited layer tends to grow increasingly thicker relative to the edges as represented by the increasingly positive percentage of non-uniformity. Thus, by adjusting the ratio of the RF power to the coil relative to the DC power biasing the target, the material being sputtered from the coil can be increased or decreased as appropriate to effectively compensate for non-uniformity of the material being deposited from the target to achieve a more uniform deposited layer comprising material from both the target and the coil. For the single turn coil 104, a coil RF power to target DC power ratio of approximately 1.5 has been found to provide satisfactory results on an 8 inch diameter wafer. FIG. 8 depicts the results of varying coil RF power to target DC power for a three turn coil in which a ratio of approximately 0.7 is indicated as being optimal.

It is further believed that the relative amounts of sputtering between the coil and the target may also be a function of the DC biasing of the coil 104 relative to that of the target 110. This DC biasing of the coil 104 may be adjusted in a variety of methods. For example, the matching network 302 typically includes inductors and capacitors. By varying the capacitance of one or more capacitors of the matching network, the DC biasing of the coil 104 might be adjusted to achieve the desired level of uniformity. In one embodiment, the RF power to the coil and the DC biasing of the coil 104 may have separate adjustment inputs to achieve the desired results. An alternative power arrangement could include two RF generators operated at slightly different frequencies. The output of one generator would be coupled to the coil in the conventional manner but the other generator at the slightly different frequency would be capacitively coupled to the coil such that a change in the power level of the second generator would change the DC bias of the coil. Such an arrangement could provide independent control of the RF power and DC bias applied to the coil. At present, it is believed that relatively large changes in DC bias to the coil for a given RF power level would be necessary to have a substantial effect on the amount of material sputtered from the coil.

Each of the embodiments discussed above utilized a single coil in the plasma chamber. It should be recognized that the present invention is applicable to plasma chambers having more than one RF powered coil. For example, the present invention may be applied to multiple coil chambers for launching helicon waves of the type described in copending application Ser. No. 08/559,345 now U.S. Pat. No. 6,264,812.

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary from, for example, 1 MHz to 100 MHz. An RF power setting of 4.5 kW is preferred but a range of 1.5–5 kW is believed to be satisfactory. In some applications, energy may also be transferred to the plasma by applying AC or DC power to coils and other energy transfer members. A DC power setting for biasing the target 110 of 3 kW is preferred but a range of 2–5 kW and a pedestal bias voltage of –30 volts DC is believed to be satisfactory for many applications.

In the illustrated embodiment, the shield 106 has a diameter of 13 ½" but it is anticipated that good results can be obtained so long as the shield has a diameter sufficient to extend beyond the outer diameter of the target, the substrate support and substrate, to shield the chamber from the plasma. The shields may be fabricated from a variety of materials including insulative materials such as ceramics or quartz. However, the shield and all metal surfaces likely to be coated with the target material are preferably made of the same material as the sputtered target material but may be made of a material such as stainless steel or copper. The material of the structure which will be coated should have a coefficient of thermal expansion which closely matches that of the material being sputtered to reduce flaking of sputtered material from the shield or other structure onto the wafer. In addition, the material to be coated should have good adhesion to the sputtered material. Thus for example if the deposited material is titanium, the preferred metal of the shields, brackets and other structures likely to be coated is bead blasted titanium. Any surfaces which are more likely to sputter such as the end caps of the coil support and feed through standoffs would preferably be made of the same type of material as the target such as high purity titanium, for example. Of course, if the material to be deposited is a material other than titanium, the preferred metal is the deposited material, stainless steel or copper. Adherence can also be improved by coating the structures with molybdenum prior to sputtering the target. However, it is preferred that the coil (or any other surface likely to sputter) not be coated with molybdenum or other materials since the molybdenum can contaminate the workpiece if sputtered from the coil.

The wafer to target space is preferably about 140 mm but can range from about 1.5" to 8". For this wafer to target spacing, satisfactory coverage, i.e., the ratio of aperture bottom deposition thickness to field deposition thickness, has been achieved with a coil diameter of about 11 ½ inches spaced from the target by a distance of about 2.9 inches. It has been found that increasing the diameter of the coil which moves the coil away from the workpiece edge has an adverse effect on bottom coverage. On the other hand, decreasing the coil diameter to move the coil closer to the wafer edge can adversely effect layer uniformity. It is believed that decreasing the coil diameter causes the coil to be more closely aligned with the target resulting in substantial deposition of material from the target onto the coil which in turn can adversely effect the uniformity of material being sputtered from the coil.

Deposition uniformity also appears to be a function of coil spacing from the target. As previously mentioned, a spacing of about 2.9 inches between the coil and target has been found satisfactory for a target to wafer spacing of 140 mm. Moving the coil vertically either toward or away from the target (or wafer) can adversely effect deposition layer uniformity.

Figure 9:
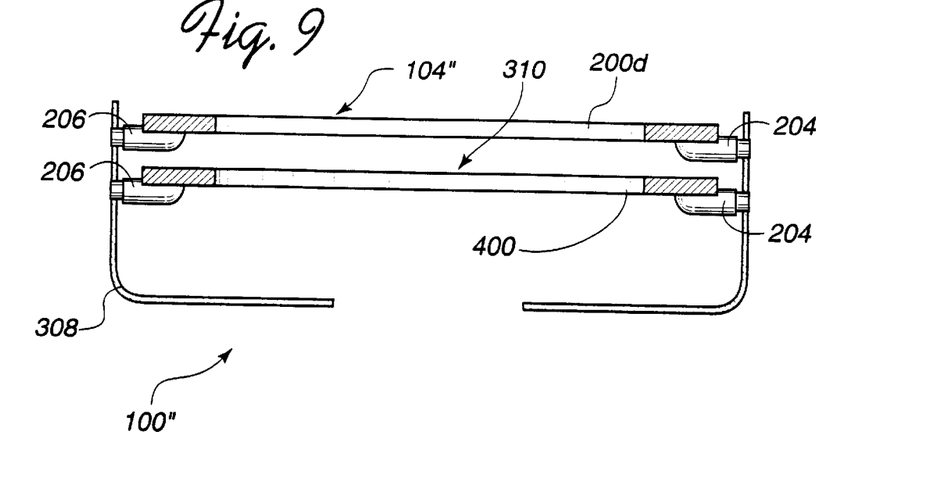
FIG. 9 is a schematic partial cross-sectional view of a plasma generating chamber in accordance with another embodiment of the present invention utilizing dual coils, one of which is RF powered for plasma generation and the other of which is DC biased to provide a supplemental target.
Figure 10:
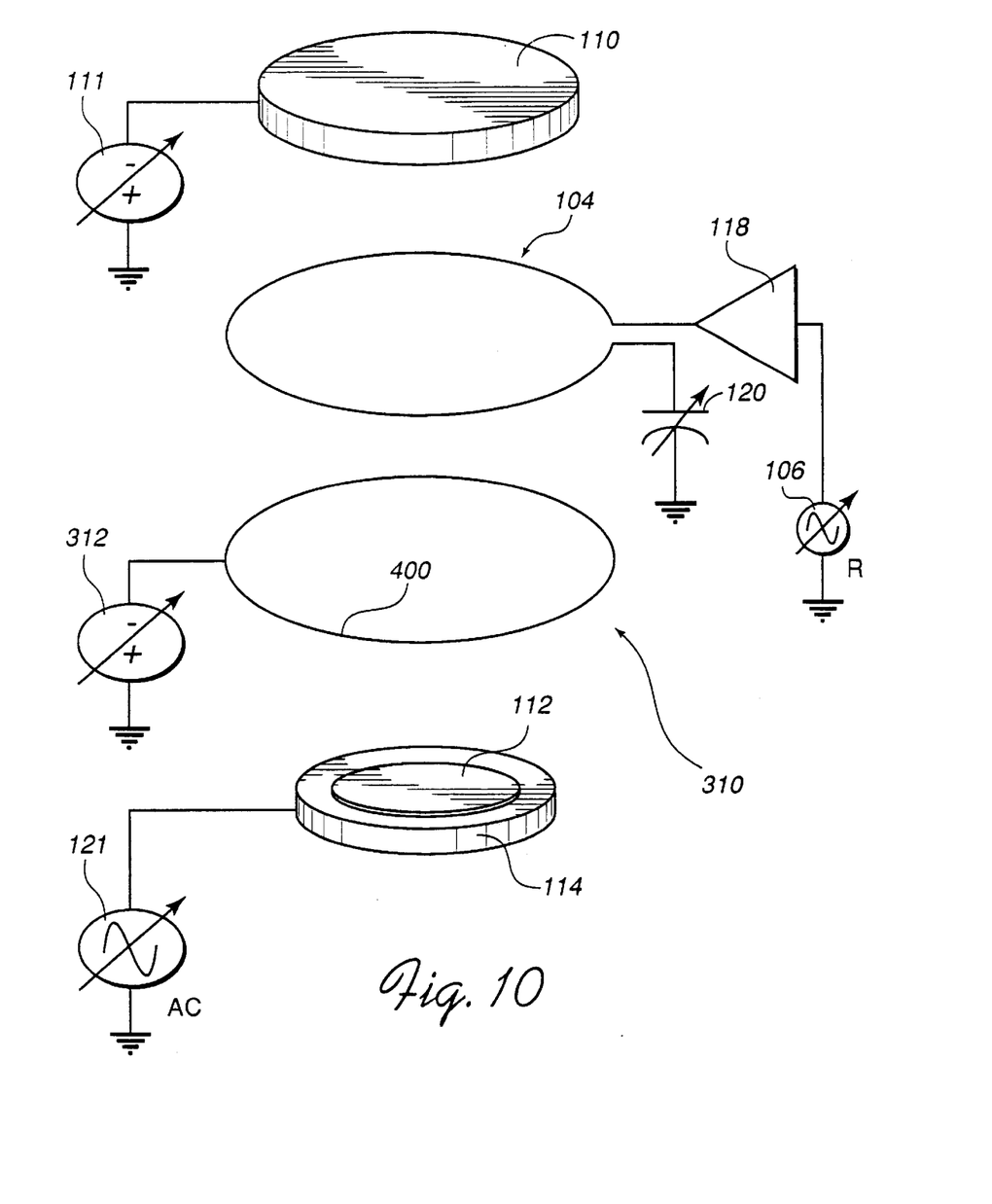
FIG. 10 is a schematic diagram of the electrical interconnections to the plasma generating chamber of FIG. 10.

As set forth above, the relative amounts of material sputtered from the target 110 and the coil 104 are a function of the ratio of the RF power applied to the coil and the DC power applied to the target. However, it is recognized that in some applications, an RF power level which is optimum for improving the uniformity of the deposited layer of materials from the coil and the target may not be optimum for generating a plasma density for ionization. FIG. 9 illustrates an alternative embodiment of a plasma chamber 100" having a coil 104" formed of a single open ended coil ring 200d of the type depicted in FIG. 3. As shown in FIG. 10, the coil 104" is coupled through the shield 308 by feedthrough standoffs 206 to a matching network 118 and an RF generator 106 in the same manner as the coils 104 and 104' described above. However, the chamber 100" has a second target 310 which, although generally shaped like a coil, is not coupled to an RF generator. Instead, the second target 310 formed of a flat closed ring 400 is coupled through feedthrough standoffs 206 to a variable negative DC bias source 312 as shown in FIG. 10. As a consequence, the chamber has three "targets," the first and second targets 110 and 310, respectively, as well as the RF coil 104". However, most of the material sputtered from the coil 104" and the second target 310 originates from the DC biased target 310 rather than the RF powered coil 104".

Such an arrangement has a number of advantages. Because most of the material sputtered from the coils originates from the second target 310 rather than the coil 104", the relative amounts of material being sputtered from the coil 104" and the first and second targets 110 and 310 are a function primarily of the relative DC power biasing the target 310 and the target 110. Hence the variable DC power sources 111 and 312 biasing the first target 110 and the second target 310, respectively, can be set to optimize the uniformity of the deposition of material more independently of the RF power setting for the RF generator 106 powering the coil 104". Conversely, the RF power to the coil 104" can be set more independently of the DC biases to the target 110 and the target 310 in order to optimize plasma density for ionization purposes.

In addition, it is believed that the RF power levels for the coil 104" may be lower as compared to those for the coil 104. For example, a suitable power range for the coil 104" is 1.5 to 3.5 kW RF. The power ranges for the primary target 110 and the secondary target, i.e., the coil 310, are 2–5 kW DC and 1–3 kW DC, respectively. Of course, values will vary depending upon the particular application.

Figure 11:
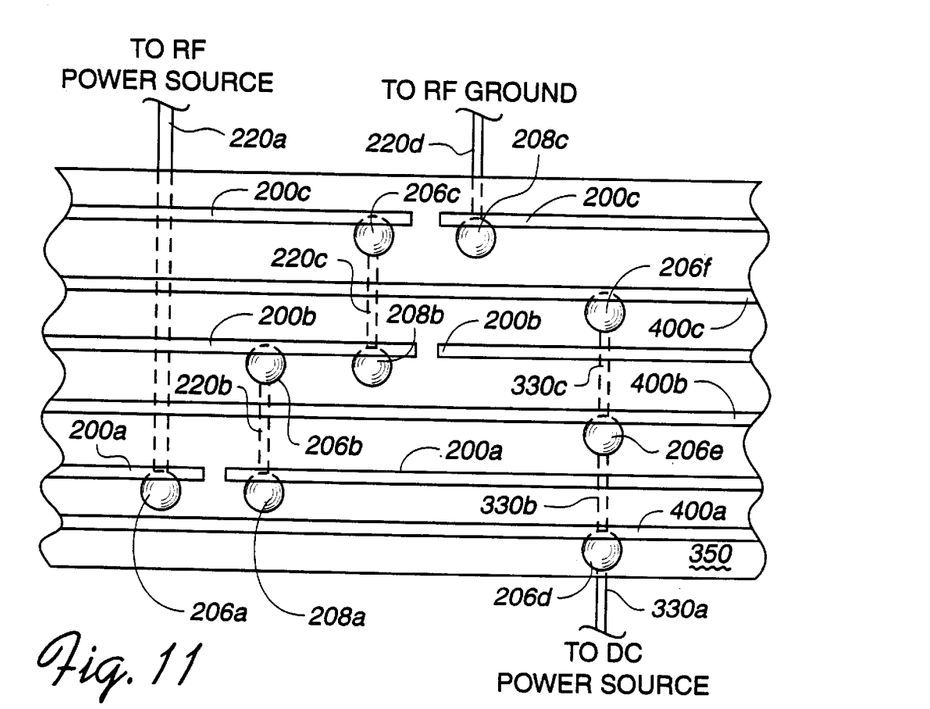
FIG. 11 illustrates a plurality of coil ring feedthrough standoffs for a plasma generating chamber having two multiple ring coils in which the rings of the two coils are interleaved.
Figure 12:
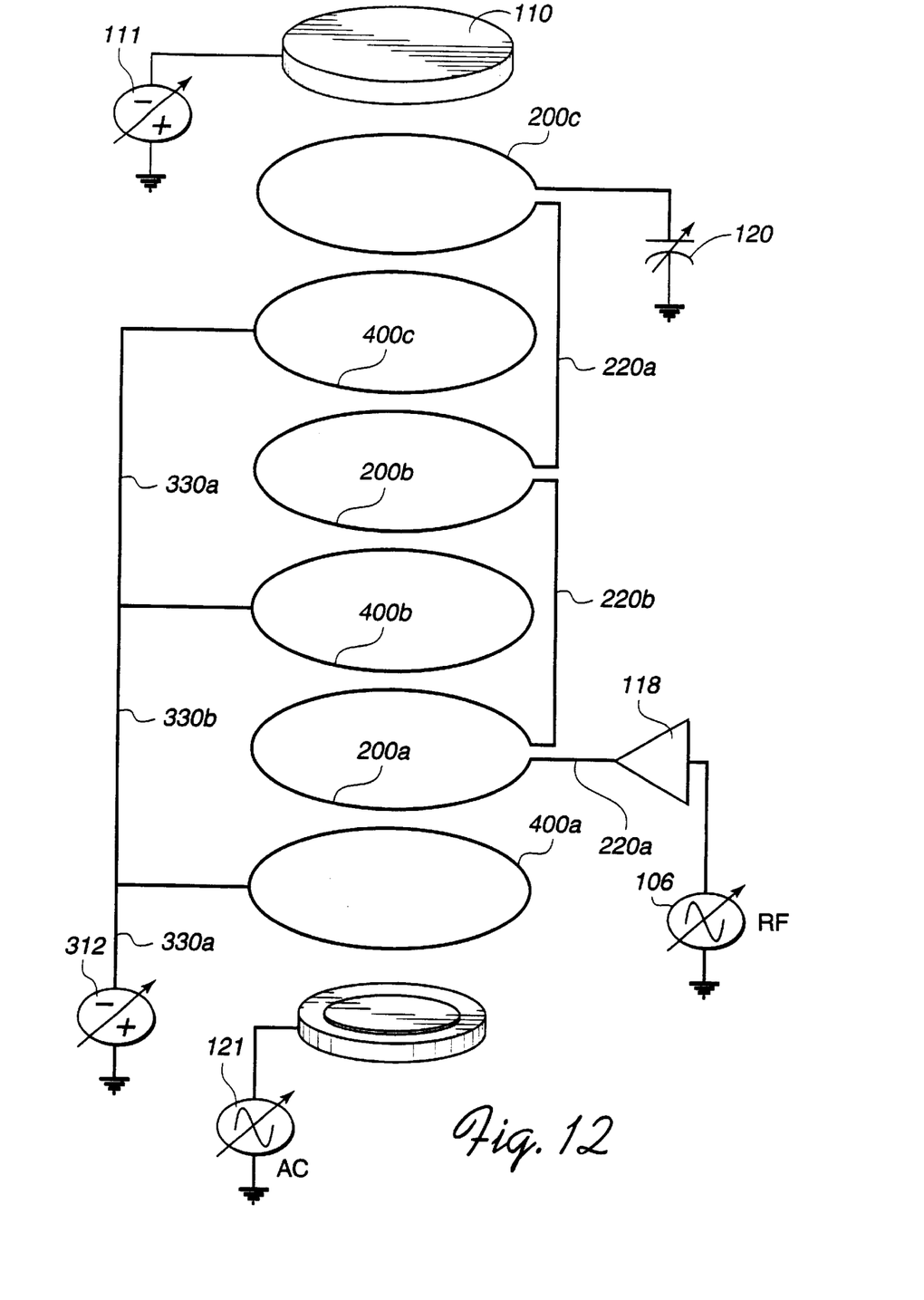
FIG. 12 is a schematic diagram of the electrical interconnections to the plasma generating chamber of FIG. 11.

FIGS. 11 and 12 show yet another alternative embodiment, which includes a multiple turn RF coil and a multiple ring secondary target in which the rings of the target are interleaved with the turns of the RF coil. The RF coil of FIG. 12, like the coil 104' of FIGS. 4–6, is formed of flat rings 200a–200c which are electrically connected together in series by RF feedthroughs which pass through the RF feedthrough standoffs 206a–206c and 208a–208c and external waveguides 220a–220d to the RF source and RF ground.

Interleaved with the coil rings 200a–200c of the RF coil are the closed rings 400a–400c of the second target. As schematically represented in FIGS. 11 and 12, the negatively biasing DC power source 312 external to the shield wall is coupled by an external strap 330a to a DC feedthrough in feedthrough standoff 206d to the lowest ring 400a of the second sputtering target. The target ring 400a is also coupled by the DC feedthrough in feedthrough standoff 206d to another external DC strap 330b which is coupled by the DC feedthrough in feedthrough standoff 206e to the middle target ring 400b. The target ring 400b is also coupled by the DC feedthrough in feedthrough standoff 206e to another external strap 330c which is coupled by the DC feedthrough in feedthrough standoff 206f to the top target ring 400c of sputtering secondary target.

Coupled together in this manner, it is seen that the target rings 400a–400c of the target 310' will be negatively DC biased so that the majority of the material sputtered from the RF coil and the secondary 400a–400c target will originate primarily from the target rings 400a–400c of the secondary target. Because the RF coil is a multiple turn coil, the current handling requirements of the feedthrough supports 206 and 208 can be substantially reduced as compared to those of the feedthrough supports 124 of the single turn coil 104 for a given RF power level as set forth above. In addition, it is believed that the life of the sputtering rings can be enhanced as a result of using multiple rings. Although the secondary sputtering targets 310 and 400a–400c have been described as being fabricated from flat rings 400, it should be appreciated that the sputtering secondary targets may be fabricated from ribbon and tubular materials as well as in a variety of other shapes and sizes including cylinders and segments of cylinders. However, it is preferred that the secondary targets be shaped so as to be symmetrical about the axis of the substrate and encircle the interior of the chamber at the periphery of the plasma. The secondary target material should be a solid, conductive material and may be of the same type or a different type of conductive material than that of the primary target 110. Although the biasing of the primary and secondary targets has been described as DC biasing, it should be appreciated that in some applications, AC or RF biasing of one or both of the primary and secondary targets may be appropriate.

A variety of precursor gases may be utilized to generate the plasma including Ar, $H_2$ or reactive gases such as $NF_3$, $CF_4$ and many others. Various precursor gas pressures are suitable including pressures of 0.1–50 mTorr. For ionized PVD, a pressure between 10 and 100 mTorr is preferred for best ionization of sputtered material.

It will, of course, be understood that modifications of the present invention, in its various aspects, will be apparent to those skilled in the art, some being apparent only after study others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An apparatus for use with a signal source, for sputter deposition of a film layer onto a substrate, comprising:
    a vacuum chamber having a substrate support member maintainable therein, a plasma generation area within said chamber, and a shield having a wall which substantially encircles said plasma generation area and said substrate support member;
    a first biasable target disposed in said chamber; and
    a sputterable coil having a first end coupled to said signal source and a second end coupled to ground, said coil being insulatively carried by said wall, substantially encircling said plasma generation area and positioned to couple energy inductively into said plasma generation area and positioned adjacent to said substrate support member to sputter material from said coil onto said substrate.

2. The sputter deposition apparatus of claim 1, further including a first power supply connected to said first target and a second power supply connected to said coil.

3. The sputter deposition apparatus of claim 2, wherein said second power supply is an RF power supply.

4. The apparatus of claim 1, further including a second biasable sputter target disposed about said space defined between said first biasable target and said substrate support.

5. The apparatus of claim 4, wherein said second sputter target is DC biased.

6. The apparatus of claim 5, wherein said second target is negatively biased to provide sputtering thereof by said plasma.

7. The apparatus of claim 6, wherein each of said targets is of the same material.

8. The apparatus of claim 6, wherein said second target is a solid member.

9. The apparatus of claim 1, wherein said coil inductively couples into a gas maintainable in said chamber to create a plasma therefrom.

10. The apparatus of claim 1, wherein said coil is a solid member.

11. The apparatus of claim 1 further comprising a capacitor coupled between said coil second end and ground.

12. The apparatus of claim 11 wherein said capacitor maintains a bias on said coil at a level sufficient to cause said coil to be sputtered in the presence of said plasma.

13. An apparatus for use with a signal source, for energizing a plasma within a semiconductor fabrication system for depositing material onto a workpiece, the apparatus comprising:
    a semiconductor fabrication chamber having a plasma generation area within said chamber;
    a shield having a wall which substantially encircles said plasma generation area; and
    a metal material coil having a first end coupled to said signal source and a second end coupled to ground, said coil being insulatively carried by said shield wall, substantially encircling said plasma generation area and positioned to couple energy inductively into said plasma generation area and to sputter metal material from said coil onto said workpiece.

14. The apparatus of claim 13 further comprising a target made of titanium.

15. The apparatus of claim 13 further comprising a target made of a material selected from Al, Cr, Te and $SiO_2$.

16. An apparatus for use with a signal source, for energizing a plasma within a semiconductor fabrication system for depositing material onto a workpiece having a center and an edge, the apparatus comprising:
    a semiconductor fabrication chamber having a plasma generation area within said chamber;
    a sputtering target carried within said chamber and made of a first material, said target being positioned to sputter said target material onto said workpiece so that target material is deposited at a higher rate toward said center of said workpiece as compared to said edge of said workpiece; and
    a coil carried within said chamber and formed of the same type of material as said target, said coil being having a first end coupled to said signal source and a second end coupled to ground, said coil being positioned to couple energy inductively into said plasma generation area and to sputter said coil material onto said workpiece so that coil material is deposited at a higher rate toward said edge of said workpiece as compared to said center of said workpiece so that both said coil material and said target material are deposited on said workpiece to form a layer thereon.

17. The apparatus of claim 16 further comprising a biasing circuit including said signal source coupled to said coil first end and a capacitor coupled between said coil second end and ground so that said coil material is deposited on at least a portion of said workpiece at a rate of at least 50 Å per minute.

18. The apparatus of claim 16 wherein said signal source is a generator for applying RF power to said coil, said apparatus further comprising:
    a source for applying a DC bias to said target; and
    a source for applying a DC bias to said workpiece;
    wherein the power of said target DC bias and said coil RF power have a predetermined relationship so that said coil material deposited on said workpiece compensates for nonuniformity in thickness of said target material deposited on said workpiece.

19. The apparatus of claim 18 wherein the ratio of said coil RF power to said target DC bias power is approximately 1.5.

20. The apparatus of claim 16 further comprising a capacitor coupled between said coil second end and ground.

21. The apparatus of claim 20 wherein said capacitor maintains a bias on said coil at a level sufficient to cause said coil to be sputtered in the presence of said plasma so that coil material is deposited at a higher rate toward said edge of said workpiece as compared to said center of said workpiece.

22. A method of depositing material on a workpiece having a center and an edge in a sputter deposition chamber, comprising sputtering target material onto said workpiece from a target positioned in said chamber so that target material is deposited at a higher rate toward said center of said workpiece as compared to said edge of said workpiece; and sputtering coil material onto said workpiece from a coil having a first end coupled to a signal source and a second end coupled to ground, said coil being positioned adjacent said workpiece so that coil material is deposited at a higher rate toward said edge of said workpiece as compared to said center of said workpiece; wherein said coil is inductively coupled to a gas in the chamber.

23. The method of claim 22 wherein said target material sputtering comprises applying DC power to said target and said coil material sputtering comprising applying RF power to said coil, said method further comprising adjusting the ratio of RF power applied to said coil relative to the DC power applied to said target to compensate for nonuniformity in thickness of said target material being sputtered onto said workpiece from said target.

24. The method of claim 23 wherein said ratio is approximately 1.5.

25. The method of claim 22 wherein said target material and said coil material are the same type of material.

26. The method of claim 22 wherein said target material and said coil material are different types of material.

27. The method of claim 22 wherein said target material and said coil material are sputtered in quantities which compensate for nonuniformities in thickness of said target material sputtered onto said workpiece.

28. The method of claim 27 wherein said coil material is deposited on at least a portion of said workpiece at a rate of at least 50 Å per minute.

29. The method of claim 22 wherein said target material and said coil material are sputtered at different rates.

30. An apparatus for use with a signal source, for energizing a plasma within a semiconductor fabrication system for depositing material onto a workpiece having a center and an edge, the apparatus comprising:

a semiconductor fabrication chamber having a plasma generation area within said chamber;

a first target carried within said chamber and made of a first material, said first target being positioned to sputter said target material onto said workpiece so that target material is deposited at a higher rate toward said center of said workpiece as compared to said edge of said workpiece;

a coil having a first end coupled to said signal source and a second end coupled to ground, said coil being positioned to couple energy inductively into said plasma generation area and to allow said coil material to be sputtered onto said workpiece so that coil material is deposited at a higher rate toward said edge of said workpiece as compared to said center of said workpiece; and a second target carried by said chamber spaced from the first target and formed of the same type of material as said first target, said second target being positioned to sputter said second target material onto said workpiece so that second target material is deposited at a higher rate toward said edge of said workpiece as compared to said center of said workpiece; so that said coil material, said second target material and said first target material are deposited on said workpiece to form a layer.

31. The apparatus of claim 30 further comprising a biasing circuit coupled to said second target so that said second target material is deposited on at least a portion of said workpiece at a rate of at least 50 Å per minute.

32. The apparatus of claim 30 wherein said coil is formed of the same type of material as said first target.

33. The apparatus of claim 30 wherein said second target is a closed ring.

34. The apparatus of claim 30 wherein said second target is a cylinder.

35. The apparatus of claim 30 wherein said signal source is a generator for applying RF power to said coil, said apparatus further comprising:

a source for applying a DC bias to said first target; and a source for applying a DC bias to said second target;

wherein the power of said first target DC bias and said second target DC bias have a predetermined relationship so that said second target material deposited on said workpiece compensates for nonuniformity in thickness of said first target material deposited on said workpiece.

36. The apparatus of claim 30 wherein said coil has a plurality of turns and said second target has a plurality of rings interleaved with the turns of said coil.

37. A method of depositing material on a workpiece, comprising energizing a plasma inductively with RF energy from a first coil having a first end coupled to an RF signal source and a second end coupled to ground;

sputtering a first target material onto the workpiece from a first target positioned facing the workpiece so that first target material is deposited thicker toward the center of the workpiece as compared to the edge of the workpiece;

sputtering a second target material onto the workpiece from a second target positioned above the workpiece so that second target material is deposited thicker toward the edge of the workpiece as compared to the center of the workpiece; and sputtering coil material onto the workpiece from said first coil which is positioned adjacent the workpiece so that coil material is deposited thicker toward the edge of the workpiece as compared to the center of the workpiece.

38. The method of claim 37 wherein said first target material sputtering comprises applying DC power to said first target and said second target material sputtering comprises applying DC power to said second target, said method further comprising adjusting the ratio of DC power applied to said second target relative to the DC power applied to said first target to compensate for nonuniformity in thickness of said first target material being sputtered onto the workpiece from said target.

39. The method of claim 37 wherein said first and second target materials and said first coil material are the same type of material.

40. The method of claim 39 wherein said coil is formed of the same type of material as said first and second, targets.

41. The method of claim 37 wherein said first and second target materials and said first coil material are sputtered in quantities which compensate for nonuniformities in thickness of said first target material sputtered onto the workpiece.

42. The method of claim 41 wherein said second target material is deposited on at least a portion of the workpiece at a rate of at least 50 Å per minute.

43. The method of claim 41 wherein said coil material and said second target material are deposited on at least a portion of the workpiece at a combined rate of at least 50 Å per minute.

44. The method of claim 37 wherein said coil has a plurality of turns and said second target comprises a plurality of rings interleaved with turns of said coil.

45. An apparatus for use with a signal source, for depositing material on a workpiece having a center and an edge, comprising:

a sputter deposition chamber;

target means disposed in said chamber, for sputtering target material onto said workpiece so that target material is deposited at a higher rate toward said center of said workpiece as compared to said edge of said workpiece; and coil means disposed in said chamber for sputtering coil material onto said workpiece so that coil material is deposited at a higher rate toward said edge of said workpiece as compared to said center of said workpiece, said coil means having a first end coupled to said signal source and a second end coupled to ground.

46. An apparatus to be installed in a semiconductor fabrication chamber having a plasma generation area within said chamber and a signal source, for energizing a plasma within a semiconductor fabrication system to ionize material to be deposited onto a workpiece, the apparatus comprising:

a shield having a wall adapted to substantially encircle said plasma generation area when installed in said chamber; and a sputter able coil having a first end adapted to be coupled to said signal source and a second end adapted to be coupled to ground, said coil being adapted to be insulatively carried by said shield wall, substantially encircling said plasma generation area and positioned to couple energy inductively into said plasma generation area and to sputter metal material from said coil onto said workpiece when installed in said chamber.

47. The apparatus of claim 46 wherein said shield is generally cylindrical in shape.

48. The apparatus of claim 46 wherein said coil is a single turn coil.

49. The apparatus of claim 46 wherein said coil is ribbon-shaped.

50. An apparatus for use with a semiconductor fabrication chamber having a sputter able target made of a first material, said target being positioned to sputter said target material onto a workpiece having a center and an edge so that target material is deposited at a higher rate toward the center of said workpiece as compared to the edge of said workpiece, and a signal source, for energizing a plasma within a plasma generation area within said chamber to ionize material to be deposited onto said workpiece, the apparatus comprising:

a coil adapted to be installed within said chamber and formed of the same type of material as said target, said coil being having a first end adapted to be coupled to said signal source and a second end adapted to be coupled to ground, said coil being adapted to be positioned to couple energy inductively into said plasma generation area and to sputter said coil material onto said workpiece when installed in said chamber so that coil material is deposited at a higher rate toward said edge of said workpiece as compared to said center of said workpiece so that both said coil material and said target material are deposited on said workpiece to form a layer thereon.

51. The apparatus of claim 50 further comprising a shield having a wall adapted to encircle said plasma generation area when installed in said chamber.

52. The apparatus of claim 51 wherein said shield is generally cylindrical in shape.

53. The apparatus of claim 50 wherein said coil is a single turn coil.

54. The apparatus of claim 50 wherein said coil is ribbon-shaped.

* * * * *